(12) United States Patent
Lazar et al.

(10) Patent No.: US 7,573,956 B2
(45) Date of Patent: *Aug. 11, 2009

(54) TIME ENCODING AND DECODING OF A SIGNAL

(75) Inventors: Aurel A. Lazar, New York, NY (US); Laszlo T. Toth, Budapest (HU)

(73) Assignee: The Trustees of Columbia University in the City of New York

( * ) Notice: Subject to any disclaimer, the term of this patent is extended or adjusted under 35 U.S.C. 154(b) by 766 days.

This patent is subject to a terminal disclaimer.

(21) Appl. No.: 11/049,401

(22) Filed: Feb. 2, 2005

(65) Prior Publication Data

US 2005/0190865 A1 Sep. 1, 2005

Related U.S. Application Data

(63) Continuation of application No. PCT/US03/33869, filed on Oct. 27, 2003.

(60) Provisional application No. 60/421,474, filed on Oct. 25, 2002, provisional application No. 60/421,675, filed on Oct. 28, 2002.

(51) Int. Cl.
*H03D 1/00* (2006.01)
*H04L 27/06* (2006.01)

(52) U.S. Cl. .................. 375/340; 375/350; 375/316; 375/216; 341/110; 341/155

(58) Field of Classification Search .............. 375/222, 375/216, 220, 316, 340, 350; 341/143, 144, 341/147, 157, 155, 110
See application file for complete search history.

(56) References Cited

U.S. PATENT DOCUMENTS

| 5,079,551 | A | | 1/1992 | Kimura et al. .............. 341/143 |
| 5,200,750 | A | | 4/1993 | Fushiki et al. .............. 341/143 |
| 5,392,042 | A | * | 2/1995 | Pellon ........................ 341/143 |
| 5,392,044 | A | | 2/1995 | Kotzin et al. |
| 5,393,237 | A | | 2/1995 | Roy et al. |
| 5,396,244 | A | | 3/1995 | Engel ......................... 341/143 |
| 5,424,735 | A | | 6/1995 | Arkas et al. |
| 5,561,425 | A | | 10/1996 | Therssen ..................... 341/143 |
| 5,568,142 | A | | 10/1996 | Velazquez et al. |
| 5,815,102 | A | | 9/1998 | Melanson .................... 341/143 |

(Continued)

OTHER PUBLICATIONS

A. A. Lazar and E. A. Pnevmatikakis, A MIMO Time Encoding Machine, Submitted for publication, Jan. 2008.

(Continued)

*Primary Examiner*—Phuong Phu

(57) ABSTRACT

Analog signals can be fully encoded as an asynchronous time sequence generated by a time encoding machine (TEM). With knowledge of the parameters of the time encoding machine, the asynchronous time sequence can be decoded using a non-linear time decoding machine. In one embodiment, the non-linear time decoding machine generates a set of weighted Dirac delta functions centered in the intervals of the asynchronous time sequence of the time encoding machine output. The weighting of each of the delta functions is determined by the parameters of the TEM as well as the values of the time sequence. The generation of the series of delta functions is a nonlinear operation (500, 510, 520). The input signal can be recovered from the series of weighted delta functions by (530) applying this series through an impulse response filter.

24 Claims, 7 Drawing Sheets

U.S. PATENT DOCUMENTS

| | | | |
|---|---|---|---|
| 6,087,968 A | 7/2000 | Roza | 341/143 |
| 6,121,910 A | 9/2000 | Khoury et al. | |
| 6,177,893 B1 | 1/2001 | Velazquez et al. | |
| 6,332,043 B1 | 12/2001 | Ogata | |
| 6,369,730 B1 | 4/2002 | Blanken et al. | 341/143 |
| 6,441,764 B1 | 8/2002 | Barron et al. | |
| 6,476,749 B1 | 11/2002 | Yeap et al. | |
| 6,476,754 B2 | 11/2002 | Lowenborg et al. | |
| 6,511,424 B1 | 1/2003 | Moore-Ede et al. | |
| 6,515,603 B1 * | 2/2003 | McGrath | 341/143 |
| 6,646,581 B1 * | 11/2003 | Huang | 341/143 |
| 6,744,825 B1 * | 6/2004 | Rimstad et al. | 375/298 |
| 7,028,271 B2 | 4/2006 | Matsugu et al. | |
| 7,336,210 B2 * | 2/2008 | Lazar | 341/110 |
| 7,479,907 B2 * | 1/2009 | Lazar | 341/110 |
| 2008/0100482 A1 * | 5/2008 | Lazar | 341/110 |

OTHER PUBLICATIONS

A. A. Lazar and E. A. Pnevmatikakis, A Video Time Encoding Machine, Submitted, Oct. 2008.

A.A. Lazar and E. A. Pnevmatikakis, Faithful Representation of Stimuli with a Population of Integrate-and-Fire Neurons. Neural Computation, 2008.

A.A. Lazar and L. T. Toth, Perfect Recovery and Sensitivity Analysis of Time Encoded Bandlimited Signals, IEEE Transactions on Circuits and Systems-I: Regular Papers, , Oct. 2004, 51(10):2060-2073.

A.A. Lazar, A Simple Model of Spike Processing. Neurocomputing, 2006, 69:1081-1085.

A. A. Lazar, Information Representation with an Ensemble of Hodgkin-Huxley Neurons, Neurocomputing, Jun. 2007, 70:1764-1771.

A.A. Lazar. Multichannel Time Encoding with Integrate-and-Fire Neurons, Neurocomputing, 65-66:401-407, 2005.

A.A. Lazar, Recovery of Stimuli Encoded with a Hodgkin-Huxley Neuron, Computational and Systems Neuroscience Meeting, COSYNE 2007, Salt Lake City, UT, Feb. 22-25, 2007, Cosyne-poster-III-94, p. 296.

A. A. Lazar, Time Encoding Machines with Multiplicative Coupling, Feedback and Feedforward, IEEE Transactions on Circuits and Systems II: Express Briefs, Aug. 2006, 53(8):672-676.

A.A. Lazar, Time Encoding with an Integrate-and-Fire Neuron with a Refractory Period, Neurocomputing, 58-60:53-58, Jun. 2004.

A. Björk and V. Pereyra, Solution of Vandermonde systems of equations, Math. Comp. 24, pp. 893-903, 1970.

A. Hudspeth and M. Konishi, Auditory Neuroscience: Development, Transduction and Integration, Oct. 2000, PNAS, 97(22):11690-11691.

A. Papoulis, Generalized Sampling Expansion, IEEE Transactions on Circuits and Systems, 1977, CAS-24(11):652-654.

A. Teolis, Computational Signal Processing with Wavelets, Applied and Numerical Harmonic Analysis. Birkhauser, 1998, chapter 4-6, pp. 59-167.

A.A. Lazar, E.K. Simonyi, and L.T. Tóth, An overcomplete stitching algorithm for time decoding machines, IEEE Transactions on Circuits and Systems-I, 2008.

A.A. Lazar, E.K. Simonyi, and L.T. Tóth, A Real-Time Algorithm for Time Decoding Machines, 14th European Signal Processing Conference EUSIPCO'06, Florence, Italy, Sep. 4-8, 2006.

A.A. Lazar, E.K. Simonyi, and L.T. Tóth, Fast Recovery Algorithms of Time Encoded Bandlimited Signals, Proceedings of the International Conference on Acoustics, Speech and Signal Processing (ICASSP'05), Philadelphia, PA, Mar. 19-23, 2005, vol. 4, pp. 237-240, 2005.

B. A. Olshausen and D. J. Field. Sparse Coding with an Overcomplete Basis Set: A Strategy Employed by V1? Vision Research, 1997, 37(23):3311-3325.

B. A. Olshausen. Sparse codes and spikes, In R. P. N. Rao, B. A. Olshausen, and M. S. Lewicki, editors, Probabilistic Models of the Brain: Perception and Neural Function. MIT Press, 2002.

B. Averbeck, P. Latham, and A. Pouget. Neural Correlations, Population Coding and Computation. Nature Reviews Neuroscience, May 2006, 7:358-366.

B. Kenneth and K. Asanovic, Energy aware lossless data compression, Proceedings of the 1st international conference on Mobile systems, applications and services, pp. 231-244, 2003, San Francisco CA.

C. Káldi, A.A. Lazar, E.K. Simonyi, and L.T. Tóth, Time Encoded Communications for Human Area Network Biomonitoring, BNET Technical Report #2-07, Department of Electrical Engineering, Columbia University, Jun. 2007.

D. Butts, C. Weng, J. Jin, C. Yeh, N. Lesica, J. Alonso, and G. Stanley, Temporal Precision in the Neural Code and the Timescales of Natural Vision. Nature, 2007, 449(7158):92-95.

D. Han and D. R. Larson. Frames, Bases and Group Representations, vol. 697 of Memoirs of the American Mathematical Society. American Mathematical Society, 2000.

D. Seidner and M. Feder, Vector Sampling Expansion. IEEE Transactions on Signal Processing, May 2000, 48(5):1401-1416.

D. Wei and J.G. Harris, Signal Reconstruction from Spiking Neuron Models, Proceedings of the ISCAS'04, vol. V, pp. 353-356, May 23-26, 2004, Vancouver, Canada.

E, Jovanov, A. Milenkovic, C. Otto, Imd Pc. de Groen, A Wireless body area network of intelligent motion sensors for computer assisted physical rehabilitation, Journal of NeuroEligineering and Rehabilitation, Mar. 2005, pp. 1-10.

E. Allier, J, Goulier, G. Sicard, A. Dezzani, E, Andre, M, Renaudin, A 120nm Low Power Asynchronous ADC, Proceedings of fhe 200S Imernmimwl Symposium on Low Power Eleclronics and Design. San Diego. CA, 2005, pp. 60-65.

E. Roza, Analog-to-digital conversion via duty-cycle modulation, IEEE Transactions on Circuits and Systems-II: Analog and Digital Signal Processing, Nov. 1997, vol. 44, No. 11, pp. 907-917.

G. L. Fain, Sensory Transduction. Sinauer Associates, Inc. Publishers, 2003, Table of Contents.

H. G. Feichtinger, K. Gróchenig and T. Strohmer, Efficient Numerical Methods in Non-uniform Sampling Theory, Numerische Mathematik, 1995, vol. 69, pp. 423-440.

H.Y. Yang and R. Sarpeshkar, A Bio-inspired ultra-energy-efficient analog-to-digital Converter for biomedical applications, IEEE Transactions on Circuits and Systems, Regular Papers, Nov. 2006, vol. 53, No. 11, pp. 2349-2356.

I. Daubechies. Ten Lectures on Wavelets. Society for Industrial and Applied Mathematics, 1992.

J. Jones and L. Palmer. An evaluation of the two-dimensional Gabor filter model of simple receptive fields in cat striate cortex. Journal of Neurophysiology, 1987, 58(6):1233-1258.

J. Keat, P. Reinagel, R. Reid, and M. Meister. Predicting Every Spike: A Model for the Responses of Visual Neurons. Neuron, 2001, 30(3):801-817.

J. W. Pillow, L. Paninski, V. J. Uzzell, E. P. Simoncelli, and E. J. Chichilnisky. Prediction and Decoding of Retinal Ganglion Cell Responses with a Probabilistic Spiking Model. The Journal of Neuroscience, 2005, 25(47):11003-11013.

J.-P. Antoine, R. Murenzi, P. Vandergheynst, and S. T. Ali. Two-Dimensional Wavelets and their Relatives. Cambridge University Press, 2004, Table of Contents.

Kovăcevíc J., Dragotti P.L., Goyal V.K., Filter Bank Frame Expansions with Erasures, Invited Paper, IEEE Transactions on Information Theory, Jun. 2002, vol. 48, No. 6, pp. 1439-1450.

M. Shinagawa, M. Fukumoto, K. Ochiai, and H. Kyuragi, A Near-Field-Sensing Transceiver for Intrabody Communication Based on the Electrooptic Effect, IEEE Transactions on Instrumentation and Measurement, vol. 53, No. 6, Dec. 2004, pp. 1533-1538.

M. Akay, Time Frequency and Wavelets in Biomedical Signal Processing, IEEE Press, Piscataway, 1998, Table of Contents.

M. Slaney. Auditory Toolbox for Matlab. Technical Report Oct. 1998, Interval Research Technical Report, 1998.

MIT-BIH Arrhythmia Database, http://www.physionet.org/physiobank/database/mitdb/.

N. Krishnapura, S. Pavan, C. Mathiazhagan, B. Ramamurthi, A baseband pulse shaping filter for Gaussian minimum shift keying, May 31-Jun. 3, 1998, The 1998 IEEE International Symposium on Circuits and Systems, ISCAS'98, vol. 1, pp. 249-252, Monterey, CA.

O. Christensen, Frames Riesz Basis, and Discrete Gabor/Wavelet Expansions, Bulletin (New York) of the American Mathematical Society, vol. 38, No. 3, Mar. 27, 2001, pp. 273-291.

O. Christensen. An Introduction to Frames and Riesz Bases. Applied and Numerical Harmonic Analysis. Birkhäuser, 2003, Table of Contents.

P. Dayan and L. Abbott. Theoretical Neuroscience: Computational and Mathematical Modeling of Neural Systems. MIT Press, 2001, Table of Contents.

P. Lichtsteiner, C. Posch, and T. Delbruck. A 128×128 120 dB 15 µs Latency Asynchronous Temporal Contrast Vision Sensor. IEEE Journal of Solid-State Circuits, 2008, 43(2):566-576.

P.R. Kinget, A.A. Lazar, and L.T. Tóth, "On the robustness of an analog VLSI Implementation of a time encoding machine", The 2005 IEEE International Symposium on Circuits and Systems, May 23-26, 2005, pp. 4221-4224, Kobe, Japan.

Parks-McClellan FIR Filter Design, (Java 1.1 Version) http://www.dsptutor.freeuk.com/remez/RemezFIRFilterDesign.html.

S. Deneve, P. Latham, and A. Pouget. Reading Population Codes: A Natural Implementation of Ideal Observers. Nature Neuroscience, Aug. 1999, 2(8):740-745.

S. Jaffard. A Density Criterion for Frames of Complex Exponentials. Michigan Mathemat- ical Journal, 1991, 38(3):339-348.

T. G. Zimmerman, Personal Area Networks: Near-field intrabody communication, IBM Systems Journal, vol. 35, 1996, pp. 611-617.

T. Strohmer, Irregular Sampling, Frames, and Pseudoinverse, Master thesis, Dep. Math. Univ. Vienna, Austria, 1991.

T. G. Zimmerman, Personal Area Networks (PAN): Near-Field Intra-Body Communicatio, MS Thesis, MIT, Sep. 1995.

W. Gautschi, On the inverses of Vandermonde and confluent Vandermonde matrices, Numer. Math. 29, 1978, pp. 445-450.

Y. C. Eldar and T. Werther, General framework for consistent sampling in hilbert spaces. International Journal of Wavelets, Multiresolution and Information Processing, 2005, 3(3):347-359.

Y.C. Eldar, Sampling with Arbitrary Sampling and Reconstruction Spaces and Oblique Dual Frame Vectors. The Journal of Fourier Analysis and Applications, 9(1):77-96, 2003.

* cited by examiner

FIG. 1
PRIOR ART
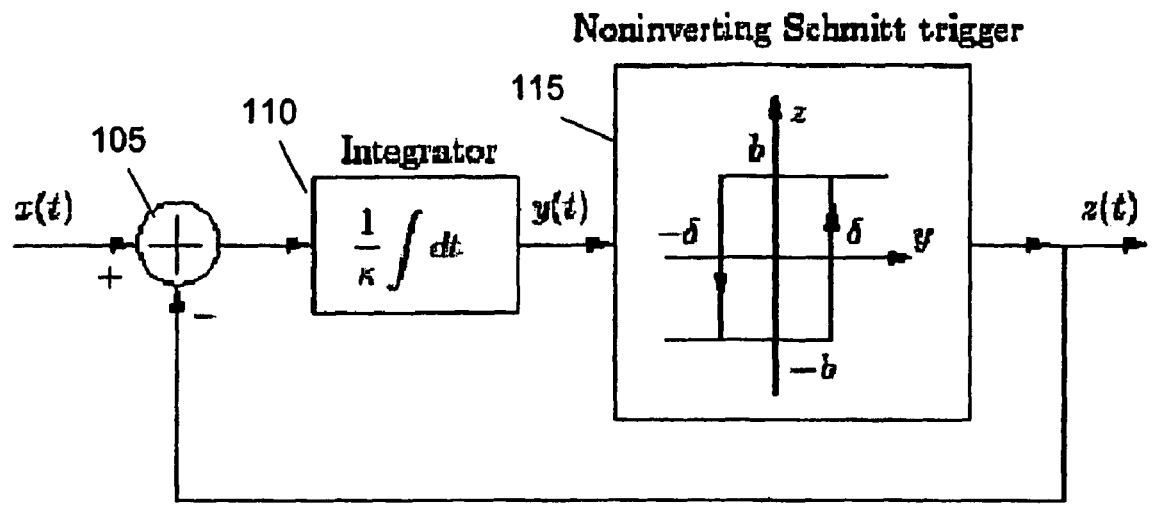
FIG. 2A
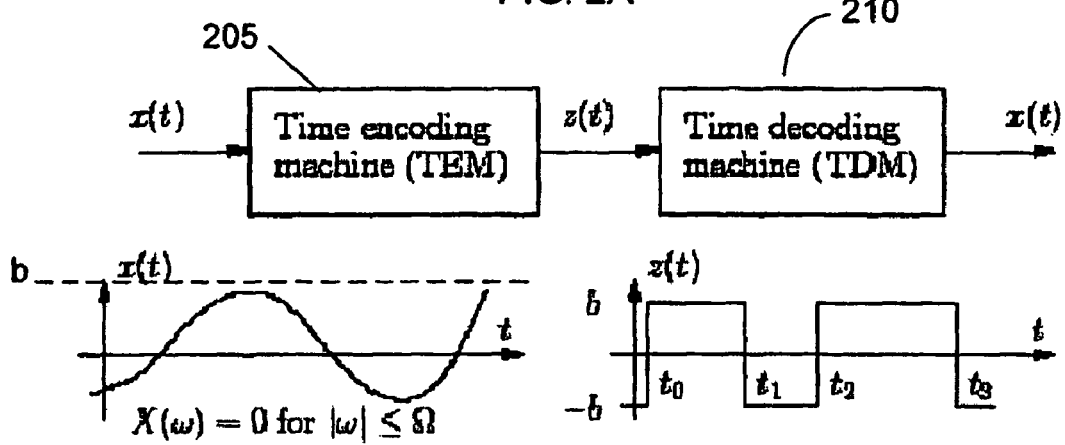
FIG. 2B
FIG. 2C

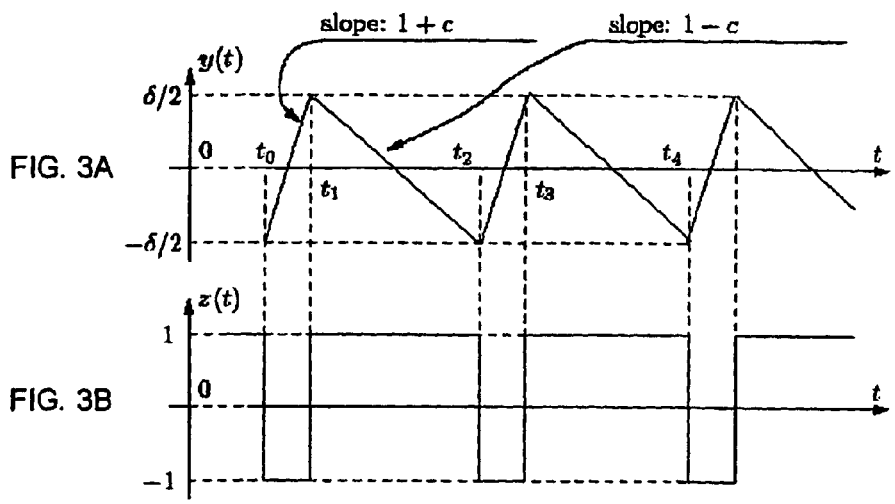
FIG. 3A
FIG. 3B
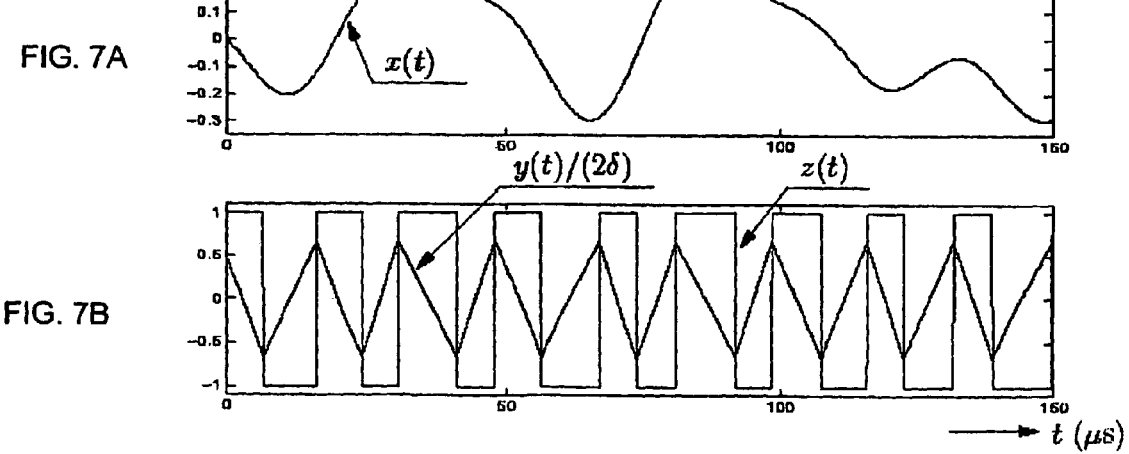
FIG. 7A
FIG. 7B

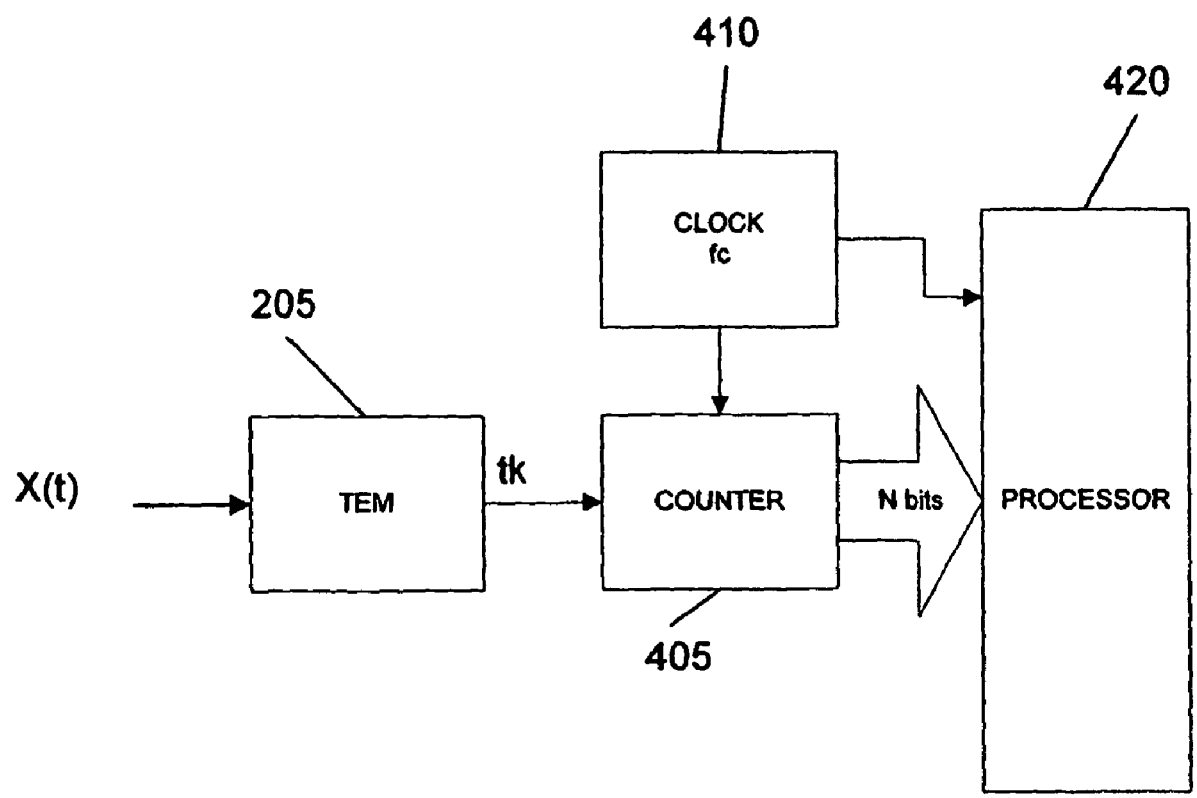

TIME ENCODING AND DECODING OF A SIGNAL

CROSS-REFERENCE TO RELATED APPLICATION

The present application is a continuation of International Patent Application No. PCT/US03/033869, filed Oct. 27, 2003, published on May 6, 2004 as International Patent Publication No. WO 04/039021, which claims priority from U.S. Provisional Patent Application Nos. 60/421,474 filed Oct. 25, 2002 and 60/421,675 filed Oct. 28, 2002, the disclosures of which are incorporated herein by reference in their entirety, and from which priority is claimed.

FIELD OF THE INVENTION

The present invention relates generally to signal processing and more particularly relates to circuits and methods for recovering a signal from the output of a time encoding machine which maps amplitude information into an asynchronous time sequence.

BACKGROUND OF THE INVENTION

Most signals in the world in which we live are analog, i.e., cover a continuous range of amplitude values. However, most computer systems for processing these signals are binary digital systems. Generally, synchronous analog-to-digital (A/D) converters are used to capture analog signals and present a digital approximation of the input signal to a computer processor. That is, at precise moments in time synchronized to a system clock, the amplitude of the signal of interest is captured as a digital value. When sampling the amplitude of an analog signal, each bit in the digital representation of the signal represents an increment of voltage, which defines the resolution of the A/D converter. Analog-to-digital conversion is used in numerous applications, such as communications where a signal to be communicated may be converted from an analog signal, such as voice, to a digital signal prior to transport along a transmission line. Applying traditional sampling theory, a band limited signal can be represented with a quantifiable error by sampling the analog signal at a sampling rate at or above what is commonly referred to as the Nyquist sampling rate.

While traditional A/D conversion techniques have been effective, techniques based on amplitude sampling have limitations. For example, it has been a continuing trend in electronic circuit design to reduce the available operating voltage provided to integrated circuit devices. In this regard, over the last decade, power supply voltages have decreased from five volts to three volts and there remains a desire to reduce this further, such as to one volt or less. While digital signals can be readily processed at the lower supply voltages, traditional synchronous sampling of the amplitude of a signal becomes more difficult as the available power supply voltage is reduced and each bit in the A/D or D/A converter reflects a substantially lower voltage increment. Thus, there remains a need to develop circuits and methods for performing high resolution A/D and D/A conversion using substantially lower power supply voltages which will be desired in future designs.

In contrast to sampling a signal using synchronous A/D converters, circuits are known for performing asynchronous time encoding of a signal. One such circuit, referred to as an asynchronous sigma delta modulator (ASDM) is disclosed in U.S. Pat. No. 6,087,968 to Roza ("the '968 patent"). An example of such an ASDM is illustrated herein in FIG. 1. The ASDM generates an asynchronous duty cycle modulated square wave at output z(t) which is representative of the input signal, x(t). In the '968 patent, an ASDM is used to form an analog-to-digital converter by providing the output of the ASDM to a sampler and a linear decimating filter which is sampled at a rate above the bandwidth of the input signal. A problem with this approach is that the ASDM introduces non-linearities in z(t) which cannot be recovered using a linear decimation filter. As a result, the degree of signal recovery is limited. Another shortcoming with this approach is that the output of the ASDM must be over sampled by a high frequency clock. As the bandwidth of the input signal increases, the clock frequency also increases. Even if the desired clock rate can be achieved, such high frequency clocks demand significant power consumption.

While the '968 patent discloses the use of an ASDM to time encode an analog signal, certain characteristics of the ASDM circuit were not previously appreciated. For example, the '968 patent does not disclose a method of designing the ASDM in order to have the ASDM output signal be fully invertible, i.e., allow for theoretically perfect recovery of the input signal. Further, the '968 patent does not disclose that the ASDM is a non-linear system and that a non-linear recovery method is required to fully take advantage of this circuit.

OBJECTS AND SUMMARY

It is an object of the present invention to provide circuits and methods to encode and decode a band limited signal using asynchronous processes.

It is another object of the present invention to provide non-linear operations for recovering an input signal from the output of a time encoding machine, such as an ASDM or integrate and fire neuron circuit.

It is an object of the present invention to provide an improved method of recovering an input signal from the output of an asynchronous sigma delta modulator (ASDM).

In accordance with the present invention, a method is provided for recovering an input signal x(t) from the output signal of a Time Encoding Machine (TEM) which provides a binary asynchronous time sequence in response to a bounded input signal x(t). The method includes receiving the asynchronous time sequence from the TEM and measuring the transition times, such as the time of zero crossings, of the TEM output signal. From the TEM transition times, a set of weighted impulse functions is generated. The generation of weighted impulse functions can be computed, such as by applying an algorithm that resolves a non-linear recursive relationship or matrix form non-linear relationship. The input signal can be recovered by applying the set of weighted impulse functions to an impulse response filter. If the transition times are exactly known, the TEM is fully invertible and the input signal can be exactly recovered by the present methods. If the transition times are quantized, the quantization level determines the accuracy of recovery in a manner that is analogous to conventional amplitude sampling.

In one embodiment, the weighted impulse functions are a set of weighted Dirac delta functions which are centered in the time interval of successive zero crossings of the TEM output. The weighting value for each impulse function is related to the design parameters of the TEM and the transition times. For example, the weighted impulse functions can have weighting value coefficients $c_k$ which can be expressed in matrix form as a column vector, c:

$$c = G^+ q$$

where q is a column vector and $$\int_{t_k}^{t_{k+1}} x(u)du = (-1)^k[-b(t_{k+1}-t_k)+2\kappa\delta]$$

$$q = \left[\int_{t_k}^{t_{k+1}} x(u)du\right] \text{ and } G = \left[\int_{t_1}^{t_{l+1}} g(u-s_k)du\right] \text{ and where } G^+$$

denotes the pseudo-inverse of matrix G. The input signal x(t) can be recovered from the vector c by passing a train of impulse functions weighted by this vector through an ideal impulse response filter. The impulse response filter can be described as $g(t)=\sin(\Omega t)/\pi t$. The recovery of the input signal can then be expressed in matrix form as: x(t)=gc, where g is a row vector, $g=[g(t-s_k)]^T$.

The TEM can take on many forms so long as the transition times from the TEM output relate to the input signal in an invertible manner. Examples of TEM circuits include an asynchronous sigma delta modulator circuit and an integrate and fire neuron circuit.

The methods of the present invention can be embodied in a time decoding machine (TDM) circuit. The TDM will generally be formed using a digital microprocessor or digital signal processing integrated circuit which has been programmed to carry out the methods of the present invention.

BRIEF DESCRIPTION OF THE DRAWING

Further objects, features and advantages of the invention will become apparent from the following detailed description taken in conjunction with the accompanying figures showing illustrative embodiments of the invention, in which:

FIG. 1 is a block diagram of a known circuit embodiment of an asynchronous sigma delta modulator (ASDM), which can be used as an embodiment of a time encoding machine (TEM) in the present invention;

FIG. 2A is a simplified block diagram illustrating a system in accordance with the present invention including a time encoding machine (TEM) for asynchronous time encoding of an input signal and a time decoding machine for subsequently recovering the input signal from the TEM output signal;

FIGS. 2B and 2C pictorially represent the operation of the ASDM of FIG. 1 operating as a time encoding machine where FIG. 2B is a graphical representation of an analog input signal, x(t), to the system of FIG. 2A and FIG. 2C is a graphical representation of the time encoded signal z(t) from the time encoding machine;

FIG. 3 is a simplified flow chart illustrating the operations of the time encoding machine (TEM) and time decoding machine (TDM) of the present invention;

FIG. 4 is a block diagram of a circuit including a TEM and one embodiment of a quantizer for the TEM output signal.

FIGS. 7A and 7B are timing diagrams illustrating the operation of a TEM in response to a time varying input signal, x(t);

Figure 5:
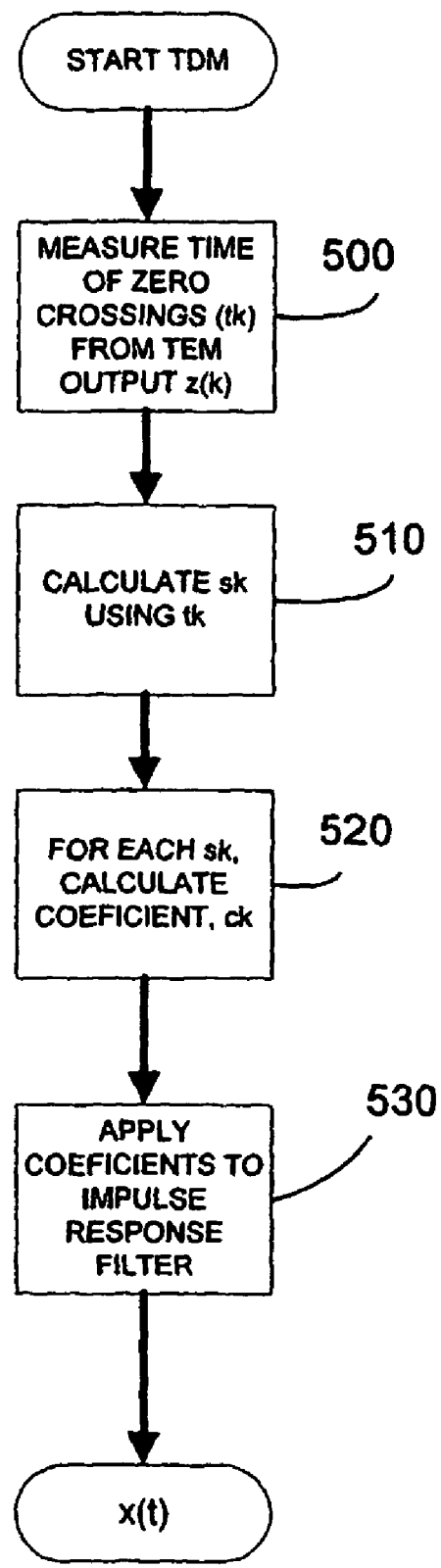
FIG. 5 is a pictorial representation of the operation of the time decoding machine.

Throughout the figures, the same reference numerals and characters, unless otherwise stated, are used to denote like features, elements, components or portions of the illustrated embodiments. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

The present invention uses time encoding to digitize an analog signal and also uses appropriate non-linear decoding methods for subsequent recovery of the input signal. Thus, the systems and methods described apply to analog-to-digital (A/D) conversion and digital-to-analog (D/A) conversion using time encoding of a signal.

In the present application, the concepts of a time encoding machine (TEM) and time decoding machine (TDM) are introduced. As used herein, a TEM is a circuit or process which receives a bounded input signal and generates an asynchronous set of binary transitions, the timing of which are related to the amplitude of the input signal. More generally, a TEM is a circuit or process which maps amplitude information into time information. A time decoding machine is a circuit or process which is responsive to transition time data from a TEM and can process the transition time data to recover the input signal with arbitrary accuracy.

The block diagram of FIG. 2A provides a simplified description of the present invention. A band limited, amplitude limited signal x(t), as shown in FIG. 2B, is applied to the input of a Time Encoding Machine (TEM) 205 which generates a binary, asynchronous output z(t), illustrated in FIG. 2C. The TEM output signal z(t) is an asynchronous binary output whose zero crossings $(t_o, t_1, \ldots t_k)$ are related to the amplitude of the input signal. It is now understood in connection with the present invention that the signal z(t) relates to the input signal x(t) in a non-linear fashion. By using the inverse of the non-linear relationship in a decoding algorithm in a Time Decoding Machine (TDM) 210, the input signal, x(t), can be recovered from knowledge of the zero crossings in z(t). If the zero crossings in z(t) are known precisely, then perfect recovery of the input signal is possible. If there is error attributable to the measurement of the zero crossings, the error in the recovery of x(t) is equivalent to magnitude of the error in the recovery of a signal using traditional amplitude sampling. That is, for the same number of bits used in sampling the signal, the current time encoding methods yield comparable results to known amplitude sampling systems.

FIG. 1 is a block diagram of a known Asynchronous Sigma Delta Modulator (ASDM) circuit which is suitable for use in one embodiment of TEM 205. The circuit of FIG. 1 generates a two-state output signal (b, −b) whose zero crossings are asynchronously determined by the amplitude of the input signal x(t) in combination with design parameters of the circuit. Because the timing of the zero crossings is asynchronously determined by the amplitude of the input signal, the ASDM can be viewed as a form of time encoding machine (TEM). If the input signal x(t) to the TEM is a band limited signal, then the system is invertible and the input signal, x(t), can be recovered from the TEM output signal, z(t), using an appropriate recovery process in the TDM. If the transition times are known exactly, the input signal can be fully recovered by the TDM. Accordingly, by knowing the expected maximum bandwidth of an input signal, the parameters of the TEM can be designed accordingly.

The underlying operating principle of a TEM can be understood by reference to FIG. 1. In order to realize complete recovery, it is expected that the input signal x(t) is bounded in both bandwidth, Ω, and amplitude, c. The input signal, x(t), is applied to an adder 105 which is coupled to the input of an integrator circuit 110. The integrator circuit 110 has an integration time constant, K. The output of the integrator circuit 110 is coupled to the input of a non-inverting Schmitt trigger 115. The Schmitt trigger has two design parameters, the output voltage swing (b, −b) and the hysteresis value, δ. The output of the Schmitt trigger 115 provides a TEM output signal, z(t). The output of the Schmitt trigger 115 is also fed back to an inverting input to the adder 105. As a result, the bounded input signal x(t), |x(t)|≦c<b, is biased by a constant amount ±b before being applied to the integrator 110. This bias guarantees that the output of the integrator y(t) is either a positive-increasing or negative-decreasing function of time.

In the steady state, the TEM output signal z(t) can assume one of two states. In the first state, the TEM is in the state z(t)=−b and the input to the Schmitt trigger increases from −δ to δ. When the output of the integrator circuit 110 reaches the maximum value δ, a transition of the output z(t) from −b to b is triggered and the feedback signal applied to adder 105 becomes negative. In the second steady state of operation, the TEM is in the state z(t)=b and the integrator output steadily decreases from δ to −δ. When the maximum negative value −δ is reached, z(t) will reverse to −b. Thus, a transition of the output of the TEM from −b to b or from b to −b takes place each time the integrator output reaches the triggering threshold δ or −δ. The timing of these transitions, which result in the zero crossings, $t_o \ldots t_k$, depends on both the amplitude of the input signal x(t) and the design parameters of the TEM, such as the hysteresis of the Schmitt trigger, δ. Thus, the TEM is effectively mapping amplitude information into timing information using a signal dependent sampling mechanism.

The Schmitt trigger 115 can be characterized by two design parameters: the output voltage swing (b, −b) and the hysteresis value, δ. In order for the ASDM of FIG. 1 to operate as an invertible TEM, the amplitude of the input signal c must be less than output voltage swing of the Schmitt trigger, i.e., |c|<b. It has also been found that to fully recover the input signal from the TEM output signal, the hysteresis value, δ, must be less than the period of the Nyquist sampling rate. This can be expressed as: δ<(π/Ω)((b−c)/κ), where Ω represents the bandwidth of the input signal x(t), κ represents the integration constant of the TEM, and c represents the maximum amplitude of the input signal. Thus, the parameters of the TEM are to be set based on the expected limits of the input signal.

The set of trigger times $t_k$ which comprise the output of the TEM can be expressed by the recursive equation:

$$\int_{t_k}^{t_{k+1}} x(u)du = (-1)^k [-b(t_{k+1} - t_k) + 2\kappa\delta]. \qquad \text{(Eq. 1)}$$

for all integer values of k, i.e., k, k∈Z. where κ is the integration constant of the TEM, δ is the hysteresis value of the Schmitt trigger in the TEM and b is the amplitude output voltage swing of the TEM output.

By dividing by b on both sides of equation (2), the output can be normalized and can be expressed as:

$$\int_{t_k}^{t_{k+1}} \frac{x(u)}{b} du = (-1)^k \left[ -(t_{k+1} - t_k) + \frac{2\kappa\delta}{b} \right]. \qquad \text{(Eq. 2)}$$

for all k, k∈Z, i.e., k is an element of the set of all integer numbers. Therefore, the increasing time sequence $(t_k)$, k∈Z, can be generated by an equivalent circuit with integration constant κ=1 and a Schmidt trigger with parameters κδ/b and 1. In what follows, without any loss of generality, this simplified version of the TEM will be used.

The input to the TEM is a bounded function x(t) with |x(t)|≦c<1 for all t, t∈R, i.e., t is an element of the set of all real numbers. The output of the TEM is function z taking two values z: R→{−1,1} for all t, t∈R, with transition times $t_k$, k∈Z, generated by the recursive equation $$\int_{t_k}^{t_{k+1}} x(u)du = (-1)^k [-(t_{k+1} - t_k) + \delta], \qquad \text{(Eq. 3)}$$

for all k, k∈Z. This equation illustrates the mapping of the amplitude information of the signal x(t), t∈R, into the time sequence $(t_k)$, k∈Z.

In the description that follows, the operation of the TEM is evaluated for the case where the input signal is a constant DC value. For this example, it is assumed that the TEM takes the form substantially presented in FIG. 1 and consists of an integrator with integrator constant κ=1 and Schmitt trigger with parameters δ from −δ/2 to δ/2 and b=1. In this case, x(t)=c (not necessarily positive), where c denotes a given DC level. If c<−1 or c>1 the output of the integrator would become unbounded, and thus the overall TEM would become unstable. This might lead to information loss because the output z(t) cannot track the input x(t). By bounding the input amplitude such that |c|<1, the TEM is stable and the sequence of transition times reduces to the simple recursion:

$$t_{k+1} = t_k + \frac{\delta}{1 + (-1)^k c}, \qquad \text{(Eq. 4)}$$

and, therefore, $t_{k+1} > t_k$, k∈Z.

The integrator output, y(t), and the TEM output, z(t) for the case where the input signal is a constant value, are illustrated in the graphs of FIGS. 3A and 3B, respectively. Referring to FIGS. 3A and 3B, it is apparent that both the integrator output and TEM output, y(t) and z(t), respectively, are periodic signals with a period T. The period T can be expressed as:

$$T = t_{k+2} - t_k = \frac{2\delta}{1 - c^2}. \qquad \text{(Eq. 5)}$$

for all k, k∈Z.

The mean value (the 0-th order Fourier-series coefficient) of z(t) can be expressed as:

$$\frac{(-1)^k[-(t_{k+1}-t_k)+(t_{k+2}-t_{k+1})]}{T}=c, \quad \text{(Eq. 6)}$$

Equation 6 illustrates that the input signal and the output signal from the TEM have the same average value.

The transition times from the TEM output can be measured using conventional circuits and methods. FIG. 4 is one example of a circuit for quantizing and measuring the transition times $t_K$ from the output of a TEM. The TEM 205 has an output which is coupled to a strobe input of a counter circuit 405. The counter 405 is also coupled to a clock circuit 410 which increments the counter value on each clock pulse. Thus the counter circuit 405 maintains a running count of clock pulses. On each occurrence of $t_K$, the current counter value in counter circuit 405 is strobed to an N-bit output bus of the counter circuit 405. The counter output can then be provided to a digital processor 410 for storage and processing in accordance with the methods described herein. The counter values from the counter circuit 405 are transferred to the processor 410 at a rate equal to or greater than the Nyquist frequency of the input signal. Thus, the timing of the zero crossings are being quantized with a definable error based on the number of bits of resolution in the counter 405. The processor receives the quantized values of $t_k$ as an N bit word from the counter 405 on each occurrence of $t_k$.

Figure 6:
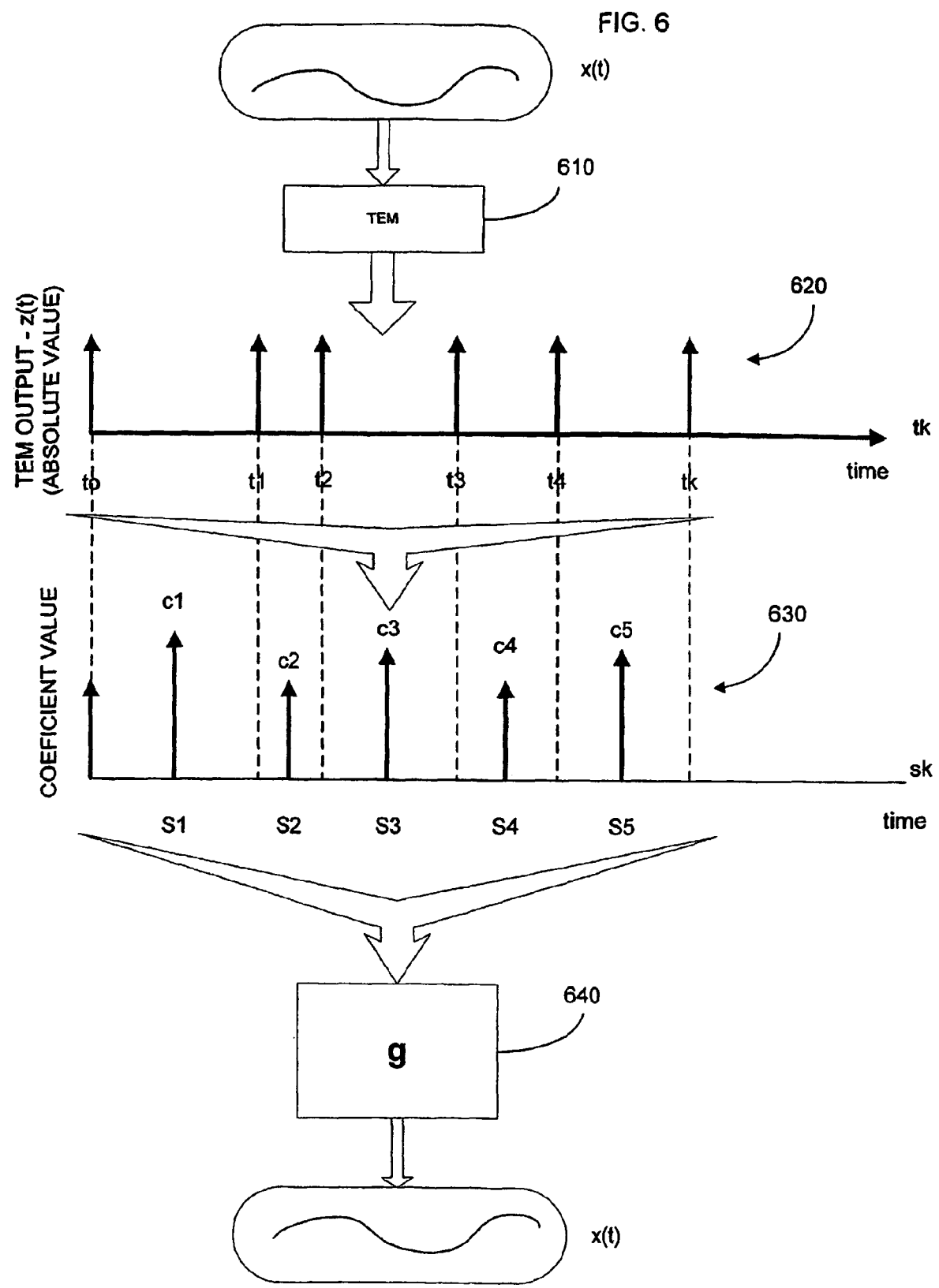
FIG. 6 is a timing diagram illustrating the operation of a TEM for a DC input signal.

The operation of the Time Decoding Machine (TDM) 210 will be described in connection with the flow chart of FIG. 5 and pictorial diagram of FIG. 6. FIG. 5 is a simplified flow diagram illustrating the operation of the TDM 210. As noted above, the TEM 205 operates by generating a set of signal dependent transition times (Step 500). The transition times are discrete real values and can be designated as $t_K=[t_0, t_1, t_2, \ldots, t_K]$. From the set of signal dependent transition times, $t_K$, the input signal x(t) can be represented as a set of weighted Dirac delta functions, $S_k$. Each of the weighted delta functions has a time value determined by the center of each successive time interval $(t_K, t_{K+1})$ and having a weighting value, $c_k$, associated therewith. For example, referring to FIG. 6, S1 in 630 has a time value at the median value between t0 and t1 which are illustrated in 620 (Step 510).

The values of the weighting coefficients can be determined from the transition times, $t_k$, and the Schmitt trigger hysteresis value, δ (step 520). The coefficients $c_k$ can be expressed in matrix form as a column vector, c:

$$c=G^+q\int_{t_k}^{t_{k+1}}x(u)du=(-1)^k[-(t_{k+1}-t_k)+\delta], \quad \text{(Eq. 7)}$$

where $q=\left[\int_{t_k}^{t_{k+1}}x(u)du\right]$ and $G=\left[\int_{t_l}^{t_{l+1}}g(u-s_k)du\right]$ where $G^+$ denotes the pseudo-inverse of matrix G.

The input signal x(t) can be recovered from the vector c by passing this vector through an ideal impulse response filter (Step 530). The impulse response filter can be described as $g(t)=\sin(\Omega t)/\pi t$. Such a filter can be formed as a digital filter using suitable programming of processor 420 (FIG. 4). It will be appreciated that other embodiments, such as analog filters and other digital filter embodiments are also contemplated by the present invention. The recovery of the input signal can be expressed in matrix form as:

$$x(t)=gc, \text{ where g is a row vector, } g=[g(t-s_k)]^T \quad \text{(Eq. 8)}$$

The method steps described in connection with the flow diagram of FIG. 5 are represented pictorially in FIG. 6. An input signal x(t) is applied to the input of a TEM 610, such as a properly designed ASDM as illustrated in FIG. 1 and described above. The TEM 610 provides an output comprising signal dependent asynchronous timing data derived from x(t) 620. Based on the value of the hysteresis of the TEM, δ, the time sequence of z(t) is converted into a matrix of weighted Dirac delta functions, $S_k$ 630. The weighted Dirac delta functions have a time value centered between consecutive zero crossings $t_k$. The weighting value is expressed above, $c=G^+q$. The sequence $S_k$ 630 can then be applied to an ideal impulse response filter g (step 640) which recovers the original signal, x(t).

In the method described above, perfect signal recovery can be achieved with knowledge of the signal bandwidth, upper bound on the signal amplitude with respect to the output swing of the Schmitt trigger and the hysteresis value of the Schmitt trigger, δ, and exact knowledge of the transition times, $t_k$. However, in many practical cases, errors are attributable in determining the values of the trigger times in z(t) as well as in determining the exact value of the hysteresis.

The error associated with the measurement of the trigger times results from quantization of the timing information such that the transition times are not exactly known, i.e., the times are known within the quantization level used. It can be shown that the resulting error from time encoding is comparable to that of amplitude sampling, when the same number of bits of resolution are used in each case.

A reasonable comparison between the effects of amplitude and time quantization can be established if we assume that the quantized amplitudes and quantized trigger times are transmitted at the same bitrate. Since $x(s_k)$ and $T_k$ are associated with the trigger times $t_k$ and $t_{k+1}$, the same transmission bitrate is achieved if the $x(s_k)$'s and the $T_k$'s are represented by the same number of bits N. With $-c \leq x \leq c$, the amplitude quantization step amounts to $\epsilon=2c/2^N$.

For time encoding $T_{min}=\min_{k \in Z}T_K \leq T_K \leq \max_{k \in Z}T_k=T_{max}$ or equivalently $0 \leq T_k-T_{min} \leq T_{max}-T_{min}$. Therefore, if $T_{min}$ is exactly known, then only measuring $T_k-T_{min}$, $k \in Z$, in the range $(0, T_{max}-T_{min})$ is needed. Hence:

$$\Delta=\frac{T_{max}-T_{min}}{2^N}=\frac{1}{2^N}\left(\frac{\delta}{1-c}-\frac{\delta}{1+c}\right)=\frac{\delta\varepsilon}{1-c^2} \quad \text{(Eq. 9)}$$

where Δ is the quantization step of the time sequence. Equation 9 illustrates how the quantization step of the time sequence is related to the amplitude quantization step.

The hysteresis value δ is often determined by analog components in the TEM, such as resistors and capacitors which exhibit a base line tolerance as well as variations over temperature, time and the like. The error that is associated with variations in the exact value of δ can be substantially eliminated by the use of a compensation method that is described below.

In the case where the TEM is embodied as an ASDM, such as illustrated in FIG. 1, following each transition of z(t), the polarity of the signal changes. This is evident from the equations for calculating $t_k$, such as Equation 3, which includes a term $(-1)^k$ which reflects this sign change on each transition, k. Since Equation 3 also includes δ for each instance of $t_k$, it will be appreciated that by evaluating the signal over a window spanning two consecutive instances of $t_k$, the δ term will be positive in one case and negative in the next, thereby canceling the effect of any variation in δ over this window. The principle behind the δ compensated algorithm can be described as follows:

$$h = \frac{1}{2}[g(t - t_{k+1})]^T, \quad q = \left[\int_{t_k}^{t_{k+2}} x(u)du\right] \text{ and}$$

$$H = \frac{1}{2}\left[\int_{t_l}^{t_{l+2}} g(t - t_{K+1})du\right].$$

The band limited signal x can be perfectly recovered from its associated trigger times $(t_k)$, k∈Z, as $$x(t) = \lim_{l \to \infty} x_l(t) = hH^+q \quad \text{(Eq. 10)}$$

where $H^+$ denotes the pseudo-inverse of H. Furthermore, $x_l(t) = hP_l q$, where $P_l$ is given by $$P_l = \sum_{k=0}^{l} (I - H)^k.$$

More generally, by defining a matrix B with ones on two diagonals:

$$B = \begin{bmatrix} \ddots & & & & & & \\ \cdots & 1 & 1 & 0 & 0 & 0 & 0 \cdots \\ \cdots & 0 & 1 & 1 & 0 & 0 & 0 \cdots \\ \cdots & 0 & 0 & 1 & 1 & 0 & 0 \cdots \\ \cdots & 0 & 0 & 0 & 1 & 1 & 0 \cdots \\ & & & & & & \ddots \end{bmatrix}$$

the input signal recovery algorithm can be expressed:

$$x(t) = g^T(t)[(B^{-1})(BG(B^{-1})^T)^+][Bq] \quad \text{(Eq. 11)}$$

The two diagonal row B matrix illustrated above is but one form of processing which can be used. It will be appreciated that other general expressions of this matrix can also be applied.

Figure 8:
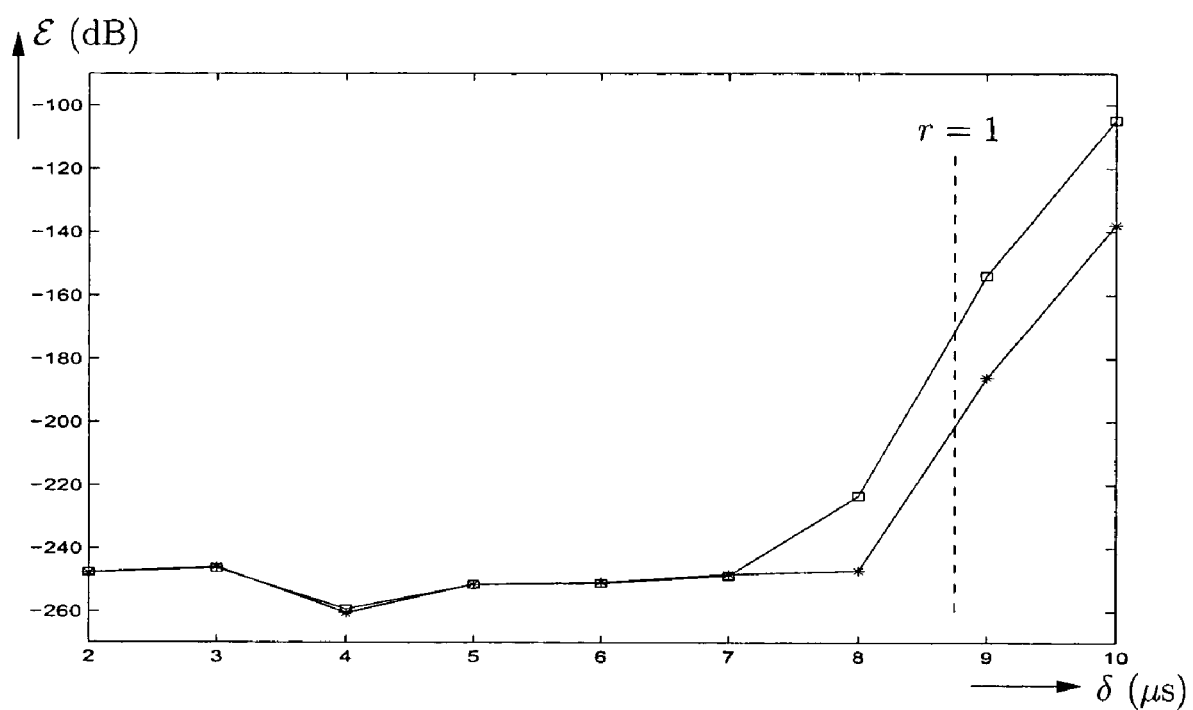
FIG. 8 is a graph illustrating recovery error versus δ for a compensated recovery algorithm in accordance with the present invention.

The compensation δ-insensitive recovery algorithm achieves perfect recovery. Simulation results for the δ-sensitive and δ-insensitive recovery algorithms are shown in FIG. 8, with graph lines denoted by stars and circles, respectively.

The δ-insensitive recovery algorithm recognizes that in two consecutive time periods of $t_k$, the period of each cycle is dependent on δ and the output changes polarity from b to −b or vice versa. By looking at the output z(t) over two consecutive time periods, i.e., $t_n$, $t_{n+2}$, the error in the recovered version of x(t) attributable to δ can effectively be eliminated.

Figure 9:
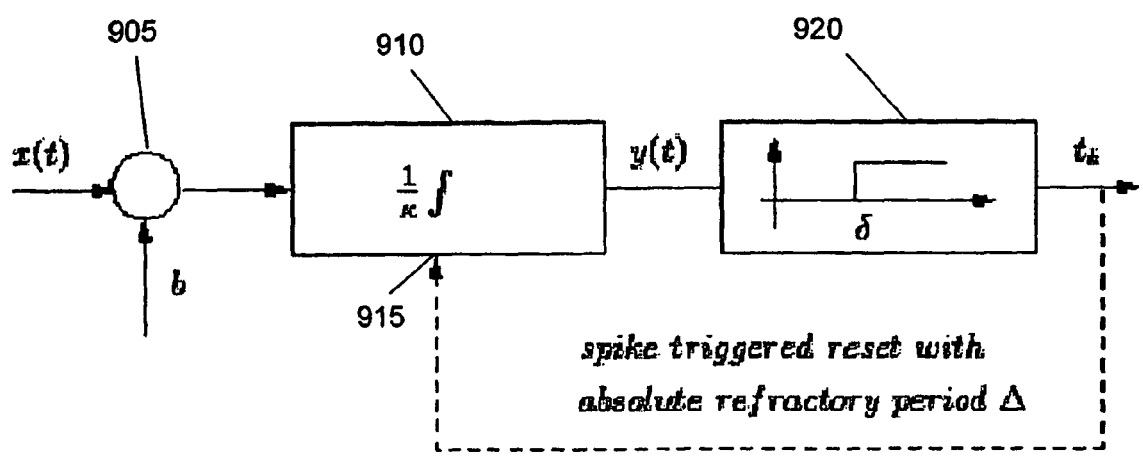
FIG. 9 is a block diagram of an alternate embodiment of a TEM circuit using an integrate and fire neuron circuit to time encode an input signal.
Figure 10:
FIG. 10 is a graph illustrating an example of the output signal from the TEM of FIG. 9.

FIG. 9 illustrates an alternate embodiment of a TEM. The circuit of FIG. 9 can be described as an integrate and fire neuron with an absolute refractory period, Δ. The TEM of FIG. 9 includes an adder 905 to which an input signal x(t) is applied. The other terminal of the adder circuit 905 is coupled to a fixed bias voltage, b. The adder 905 is coupled to the input of an integrate and dump circuit 910. The integrate and dump circuit 910 integrates the input signal with an integration constant of κ until a dump or reset signal is received on input 915. The output of the integrator is applied to a threshold detector 920 which has an output which is zero until the input signal exceeds the threshold level, δ. When the input voltage to the threshold detector 920 exceeds the threshold level value the output transitions to a logic 1. The output of the threshold detector 920 is coupled to the dump input 915 of the integrate and dump circuit 910. A small time delay element τ (not shown) may be included in this circuit path to provide a more defined pulse at the threshold detector output, which will generate the transition times $t_k$. The integrator constant κ, the threshold δ, the bias b in FIG. 9 are strictly positive real numbers; x(t), t∈R, is a signal of finite energy on R that models the input stimulus to the TEM. Furthermore, x is bounded, |x(t)|≦c<b, and band limited to [−Ω,Ω]. The output of the integrator in a small neighborhood of $t_O+\Delta$, $t > t_O+\Delta$ is given by:

$$y(t) = y(t_o + \Delta) + \frac{1}{k} \int_{t_0+\Delta}^{t} [x(u) + b] du. \quad \text{(Eq. 12)}$$

The term Δ represents the absolute refractory period of the circuit, which is a small but finite time period between the time the integrator resets and the time the integrator begins its next integration period. The absolute refractory period alters the transfer function of the integrator from h(t)=1 for t≧0 and h(t)=0 for all other t, to h(t)=1 for t≧Δ and h(t)=0 for all other t. Due to the bias signal b, the integrator output y=y(t) is a continuously increasing function. The output of the TEM is a time sequence $(t_k)$, k∈Z.

The output of the TEM of FIG. 9 is a strictly increasing set of trigger times $(t_k)$, k∈Z, that satisfy the recursive equation $$\int_{t_k+\Delta}^{t_{k+1}} x(u) du = -b(t_{K+1} - t_K - \Delta) + \kappa\delta, \quad \text{(Eq. 13)}$$

for all k, k∈Z.

For all input stimuli x=x(t), t∈R, with |x(t)|≦c<b, the distance between consecutive trigger times $t_k$ and $t_{k+1}$ is given by:

$$\frac{\kappa\delta}{b+c} + \Delta \leq t_{k+1} - t_k \leq \frac{\kappa\delta}{b+c} + \Delta \quad \text{(Eq. 14)}$$

for all k, k∈Z.

The circuit of FIG. 9 can be generalized further by considering the integrator circuit to be a non-ideal integrator. If the capacitor in the integrator circuit is considered leaky, i.e., in parallel with a finite resistance, the leaky integrator resembles a more general low pass filter response. The leaky integrate-and-fire circuit can be defined by the transfer function:

h(t)=(1/κ)$e^{-t}$ t≧0; h(t)=0 otherwise.

The present invention provides systems and methods for digitizing an analog signal using time encoding rather than amplitude encoding of the signal. The present methods also provide for recovery of the time encoded signal with an error which is comparable to that of traditional amplitude encoding when the sampling occurs at or above the Nyquist sampling rate. The present methods are particularly well suited for low voltage analog applications where amplitude sampling may be limited by the small voltage increments represented by each bit when high resolution sampling is required with only a limited voltage supply. The ability to accurately encode analog signals using limited supply voltages makes the present circuits and methods well suited to use in nano-scale integration applications.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A method of recovering an input signal from an output signal of a Time Encoding Machine (TEM), the TEM providing a binary asynchronous time sequence in response to a bounded input signal, comprising:
    measuring times of zero crossings indicating transitions of the TEM output signal of the Time Encoding Machine;
    generating a set of weighted impulse functions based upon the measured times of the zero crossings; and
    applying the set of weighted impulse functions to an impulse response filter to recover the input signal.

2. A method of recovering an input signal from the output signal of a Time Encoding Machine according to claim 1, wherein consecutive zero crossings of the TEM output signal define time intervals and wherein the weighted impulse functions have time values that are centered on the time intervals of the TEM output signal.

3. A method of recovering an input signal from the output signal of a Time Encoding Machine according to claim 1, wherein the weighted impulse functions have a weighting value determined by time values of at least two zero crossings and at least one property of the TEM.

4. The method of recovering an input signal from the output signal of a Time Encoding Machine according to claim 3, wherein the weighted impulse functions have weighting value coefficients $c_k$ which are expressed in matrix form as a column vector, c:

$$c = G^+ q$$

where $q = \left[ \int_{t_k}^{t_{k+1}} x(u) \, du \right]$ and $G = \left[ \int_{t_l}^{t_{l+1}} g(u - s_k) \, du \right]$ and where $G^+$ denotes the pseudo-inverse of matrix G.

5. The method of recovering an input signal from the output signal of a Time Encoding Machine (TEM) according to claim 1, wherein the TEM is characterized at least in part by a relationship $\delta < (\pi/\Omega)((b-c)/\kappa)$, where $\delta$ represents a hysteresis value of the TEM, b represents an output voltage of the TEM, $\kappa$ represents an integration constant of the TEM, $\Omega$ represents a bandwidth of the input signal x(t) and c represents a maximum amplitude bound of the input signal, and wherein a sequence of transition times generated by the TEM is expressed as $$\int_{t_k}^{t_{k+1}} x(u) \, du = (-1)^k [-b(t_{k+1} - t_k) + 2\kappa\delta].$$

6. A method of recovering a bounded input signal from an output signal of a time encoding machine (TEM) comprising:
    determining an amplitude and bandwidth of an input signal to the TEM;
    setting at least one TEM parameter of the Time Encoding Machine in accordance with bounding constraints based on the determined amplitude and bandwidth of the input signal;
    determining timing of zero crossings indicating state changes of the TEM output signal; and
    applying a non-linear inversion operation based at least in part on the at least one TEM parameter to recover the input signal from a subset of zero crossings.

7. The method of claim 6 wherein the TEM is an ASDM including a Schmitt trigger and wherein a parameters related to the TEM output signal is a Schmitt trigger bound level.

8. The method of claim 6 wherein the TEM includes a Schmitt trigger and wherein a parameters related to the TEM output signal is a Schmitt trigger hysteresis level.

9. The method of claim 6 wherein the TEM is an integrate and fire neuron circuit including threshold detector and wherein a parameter related to the TEM output signal is a threshold detector level.

10. The method of claim 9, wherein the integrate and fire neuron circuit includes an integrator constant and wherein a further parameters related to the TEM output signal is the integrator constant.

11. The method of claim 6, wherein the non-linear inversion operation comprises a recursive algorithm employing successive zero crossings.

12. The method of claim 11, wherein the recursive algorithm is expressed as $x(t) = g^T(t)[(B^{-1})(BG(B^{-1})^T)^+[Bq]$.

13. The method of claim 11, wherein the recursive algorithm is expressed as $$x(t) = \frac{\lim x_l(t)}{l \to \infty} = hH^+ q.$$

where $h = \frac{1}{2}[g(t - t_{k+1})]^T$, $q = \left[ \int_{t_k}^{t_{k+2}} x(u) \, du \right]$ $$H = \frac{1}{2}\left[ \int_{t_l}^{t_{l+2}} g(t - t_{K+1}) \, du \right]$$

and wherein $H^+$ denotes a pseudo-inverse of H.

14. A system for time encoding and time decoding of a signal x(t) comprising:
    a time encoding machine, the time encoding machine having an output voltage swing b, and integrator constant, $\kappa$, and a hysteresis value $\delta$, wherein $\delta < (\pi/\Omega)((b-c)/\kappa)$, where $\Omega$ represents a bandwidth of the input signal x(t) and c represents a maximum amplitude of the input signal x(t) and where $|c| < b$, the TEM generating a sequence of transition times:

$$\int_{t_k}^{t_{k+1}} x(u) \, du = (-1)^k [-b(t_{k+1} - t_k) + 2\kappa\delta].$$

a time decoding machine, the time decoding machine receiving the sequence of transition times and applying at least one non-linear operation to recover the input signal x(t) therefrom.

15. The system of claim 14, wherein the sequence of transition times are exactly known and wherein the time decoding machine fully recovers the input signal from the sequence of transition times.

16. The system of claim 14, wherein the sequence of transition times are quantized and wherein precision of the recovery of the input signal by the TDM is related to a number of bits used to quantize the sequence of transition times.

17. The system of claim 14, wherein the transition times are quantized in the TDM which includes an N-bit counter driven by a clock having a clock frequency, the counter outputting an N-bit counter value on each occurrence of a transition time.

18. The system of claim 14, wherein the TEM is an Asynchronous Sigma Delta Modulator.

19. A time decoding machine (TDM), the time decoding machine recovering a band limited signal from a sequence of transitions generated by a time encoding machine, the TDM comprising:
a time measurement circuit, the time measurement circuit generating an N-bit quantized representation of time values of zero crossings indicating the sequence of transitions provided at an input terminal of the time measurement circuit;
a processor coupled to the time measurement circuit and receiving output of the time measurement circuit at a rate at least equal to a Nyquist rate of a signal to be decoded, the processor being programmed to perform the steps:
generating a set of weighted impulse functions based upon the time values of the zero crossings; and
applying the set of weighted impulse functions to an impulse response filter to recover the input signal.

20. The TDM of claim 19, wherein consecutive zero crossings of the TEM output signal define time intervals and wherein the weighted impulse functions have time values that are centered on the time intervals of the TEM output signal.

21. The TDM according to claim 19, wherein the weighted impulse functions have a weighting value determined by the processor by evaluating consecutive zero crossings and at least one property of the TEM.

22. The TDM according to claim 21, wherein the weighted impulse functions have weighting value coefficients $c_k$ determined by the processor which are expressed in matrix form as a column vector, c:

$$c = G^+ q$$

$$\text{where } q = \left[ \int_{t_k}^{t_{k+1}} x(u)\,du \right] \text{ and } G = \left[ \int_{t_l}^{t_{l+1}} g(u - s_k)\,du \right]$$

and where $G^+$ denotes a pseudo-inverse of matrix G.

23. The TDM according to claim 20, wherein the TEM is characterized at least in part by the relationship $\delta < (\pi/\Omega)((b-c)/\kappa)$, where $\delta$ represents a hysteresis value of the TEM, b represents an output voltage of the TEM, $\kappa$ represents an integration constant of the TEM, $\Omega$ represents a bandwidth of the input signal x(t) and c represents a maximum amplitude bound of the input signal, and wherein the sequence of transition times generated by the TEM is expressed as $$\int_{t_k}^{t_{k+1}} x(u)\,du = (-1)^k [-b(t_{k+1} - t_k) + 2k\delta].$$

24. The system of claim 14, wherein the TEM is an integrate and fire neuron circuit.

* * * * *